DIRECT COUPLED, TEMPERATURE STABILIZED AUDIO AMPLIFIER

Filed Nov. 2, 1964

INVENTOR
Edmund A. Karcher
BY Dean Sclnon
ATTORNEY 3,374,441

DIRECT COUPLED, TEMPERATURE STABILIZED AUDIO AMPLIFIER

Edmund A. Karcher, Severna Park, Md., assignor to Westinghouse Electric Corporation, Pittsburgh, Pa., a corporation of Pennsylvania Filed Nov. 2, 1964, Ser. No. 408,052
5 Claims. (Cl. 330—30)

ABSTRACT OF THE DISCLOSURE

An amplifier circuit having a plurality of direct coupled transistor stages including an output stage having an output terminal. A speaker has one end connected to the output terminal and another end connected to a capacitor, the other end of which is connected to ground. In parallel with the capacitor is the serial connection of a Zener diode and resistor. The signal appearing at the output terminal is comprised of an AC component and a DC component. The DC component of the output signal appears across the capacitor and any changes in the DC level shows up entirely across the resistor of the Zener diode-resistor combination. This change in voltage is fed back to the input stage thus providing a stabilized amplifier system.

This invention in general relates to amplifiers, and more particularly to a high power, direct coupled temperature stabilized, audio amplifier which may be fabricated as an integrated circuit.

Technological advancements in the semiconductor art have led to the field of molecular electronics, also known by other names such as integrated circuitry, wherein a plurality of electrical components are formulated on a single piece of semiconductor crystal. Circuits formulated by molecular electronic techniques range from the very simple, which may only include a few diodes, to the very complex, including diodes, resistors, transistors, Zener diodes and capacitors. Since the semiconductor chip upon which the circuit is formulated is very tiny, present day technology is limited to the value of capacitors which may be made for a given chip size. For this reason the fabrication of linear amplifiers, in integrated circuit form, presents several design problems in that interstage coupling capacitors are normally too large to be incorporated in the molecular circuit. For this reason a great number of audio amplifiers are made, utilizing direct coupling between stages.

Direct coupled amplifiers require exacting DC bias levels at various points in the amplifier system. For a direct coupled amplifier utilizing a single ended push-pull class B output section, for higher efficiency, it is desirable to bias this power stage at a point equal to approximately half the power supply B+ in order to get the maximum possible positive and negative voltage swing. In circuits made up of semiconductor components as well as in integrated circuits, the stability of the circuit varies with temperature, that is, any temperature variations generally cause undesirable current variations which tend to alter the voltage at various points in the circuit from their designed value.

In order to stabilize the direct coupled amplifier with respect to temperature, various direct coupled circuits employ a negative feedback network which controls the bias on the input stage as a function of the output signal. Normally, the output terminal of the single ended class B stage is capacitively coupled to a grounded load so that only an AC signal appears across the load while the DC voltage is blocked. As the DC level at the output terminal changes it is desired to feed this change back to the input to stabilize the circuit and in order to accomplish this, various filter networks are required. If the change in DC level is to be sampled at a point in the circuit before the output, the DC feedback signal must be less than unity, and a less stable circuit results. In order to make the DC feedback signal equal to or greater than unity an active section such as an extra amplifier is needed in the feedback path.

It is therefore a primary object of the present invention to provide an improved temperature stabilized directly coupled audio amplifier.

Another object is to provide a direct coupled amplifier having a feedback circuit which will provide substantially unity DC feedback accomplished without extra filter networks, transformers or feedback amplifiers.

Another object is to provide a temperature stabilized direct coupled audio amplifier which has low temperature drift and high efficiency.

Another object is to provide a direct coupled audio amplifier the major portion of which is particularly well adapted to be fabricated as an integrated circuit.

Another object is to provide a direct coupled audio amplifier system wherein the need for a plurality of large capacitors may be eliminated.

Briefly, in accordance with the above objects, there is provided an audio amplifier having a plurality of direct coupled stages including an input stage and, preferably, a class B push-pull output stage. A two terminal load device has one terminal, or end, connected to the output terminal of the output stage and the other terminal, or end, connected to a capacitor which is grounded so that in effect the load device and capacitor are in series circuit relationship connecting the output terminal to a point of reference potential, ground. Normally, the load device is grounded but in the present invention, the load device is "floating." The capacitor is of a fairly large value such that it presents a low impedance to any AC signal and will store up the value of any DC signal applied thereto. The signal appearing at the output terminal of the class B stage includes both an AC and a DC component. The AC component after passing through the load device will be led to ground via the capacitor whereas the capacitor will assume the level of the DC component of the signal. The feedback circuit is connected across the capacitor to sense the DC voltage across it and will provide a feedback voltage proportional to the voltage across the capacitor, with respect to ground, and this feedback voltage is applied to the input stage of the amplifier to bias and stabilize it.

The feedback means for sensing the voltage across the capacitor includes a voltage reference of the type wherein the voltage drop across it remains constant, and resistance means. Since the voltage across the reference device remains constant, any change of the DC level appearing across the capacitor will then appear solely across the resistance means. Since any change is detected and fed back, the circuit uniquely provides unity, or substantially unity DC feedback for proper stabilization.

By using two amplifiers in a differential mode with a center tapped load, proper bias stabilization may be brought about without the need for the aforementioned large capacitor.

The above stated as well as further objects and advantages of the present invention will become apparent upon a reading of the following detailed specification taken in conjunction with the drawings, in which.

Figure 1:
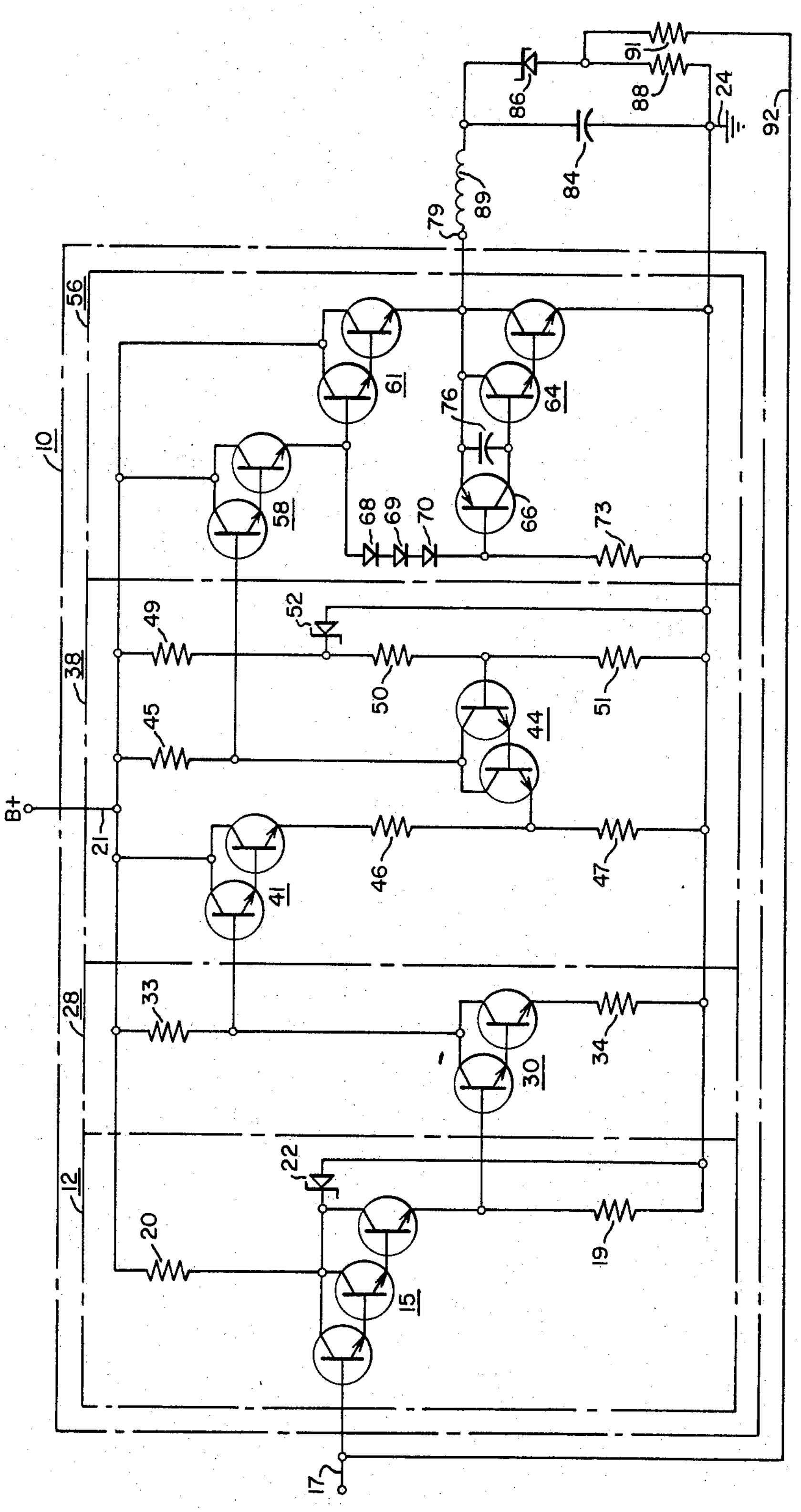
FIGURE 1 illustrates an amplifier according to the teachings of the present invention.

Referring now to FIG. 1, the direct coupled amplifier includes a plurality of direct coupled cascaded sections, or stages, a first of which is a unity gain high input impedance stage 12. The input stage 12 is an emitter follower stage and includes a plurality of transistors 15 connected in a Darlington configuration, that is, the collectors of the transistors are connected together and the emitter of a previous transistor is connected to the base of a subsequent transistor. Input signals to be amplified are applied to the input terminal 17. The high input impedance of the input stage 12 is largely determined by the AC current gain ($h_{fe}$) of each transistor in the Darlington configuration 15 in conjunction with the emitter resistance 19.

The collectors of the Darlington configuration 15 are connected through collector resistor 20 to biasing terminal 21, to which may be applied a suitable source of operating potential B+. The collectors are also connected to the cathode of Zener diode 22, having its anode electrode connected to a point of reference potential such as ground 24. The Zener diode is poled opposite to easy current flow and as such will oppose conduction of current until a certain point is reached at which the Zener will break down and conduct in the opposite direction. The point at which the Zener diode breaks down is the break down voltage which remains relatively constant. Since for any current variations the voltage across the Zener diode 22 remains constant, and since the collectors of the Darlington configuration 15 are connected to the Zener diode 22, the voltage at the collectors will remain relatively constant at a voltage equal to the breakdown voltage of the Zener diode 22. In this manner the input stage is decoupled from any power supply B+ preventing oscillation due to feedback from output to input through the power supply impedance.

The emitter follower stage 12 feeds its signal at the emitter electrode of the last transistor of the Darlington configuration 15 to a subsequent phase inverter stage 28 having a Darlington configuration 30 and collector and emitter resistors 33 and 34. The phase inverter stage 28 has a constant gain determined by the ratio of the collector-to-emitter resistance (resistance 33/resistance 34) and provides a phase inverted signal which is eventually needed for obtaining a negative DC feedback. The output of the phase inverter stage 28 is directly coupled to a subsequent common collector-common base stage 38.

The common collector-common base stage 38 functions in a manner to deliver the largest undistorted AC signal swing for driving the output stage, a factor necessary for high efficiency. In the stage 38, the Darlington configuration 41 receives the signal from the phase inverter and provides a signal to the common base Darlington 44, from the junction between resistors 46 and 47. The voltage at the base of Darlington 44 is maintained at a certain DC bias regardless of the power supply value by the action of resistors 49, 50 and 51 in conjunction with the Zener diode 52 serving to establish a constant voltage drop similar to Zener diode 22. Gain of the common collector-common base stage 38 is constant and equals the ratio: resistance 45/resistance 47.

The class B power output stage 56 includes a driver, or a buffer in the form of transistors 58 in a Darlington configuration which will provide, at the emitter of the second transistor of the configuration, a signal for driving the push-pull amplifier comprising the Darlington configuration 61 constituting a first section for amplifying positive signal excursions and the configuration 64 constituting a second section, for amplifying negative excursions of the signal supplied by the buffer 58. The first transistor 66 of the configuration 64 is of an opposite conductivity type than that of the transistors of the Darlington 61. The output signal at the collector of transistor 66 drives the subsequent two transistors arranged in a Darlington configuration.

In the single ended class B push-pull amplifier employed, distortion, known as cross-over distortion, is reduced or eliminated by biasing the input to one section at a different level than the input to the other section. To accomplish this elimination of cross-over distortion, the class B power output stage 56 includes a plurality of diodes 68, 69 and 70 which biases the configuration 61 and 64 at a low quiescent current level. Resistor 73 determines the current through the bias diodes 68, 69 and 70. A small valued capacitor 76 is electrically connected to the emitter and collector of transistor 66 to prevent any oscillation which may occur in the transistor configuration 64.

An output signal is provided at output terminal 79 in response to an input signal applied to the input terminal 17. This output signal is a composite signal consisting of a DC component and an AC component which is the amplified input signal. In the present invention the DC component of the signal is utilized to obtain a DC feedback signal for biasing the high input impedance stage 12. Since the amplifier includes one stage of phase inversion (phase inverter 28) it follows therefrom that an increasing input signal will cause a decreasing output signal and conversely a decreasing input signal will cause a corresponding increasing output signal. If, due to a change in temperature for example, various bias levels in the amplifier vary causing the output to increase, this change, or increase will be fed back to the input, effectively producing an increasing input signal, which is inverted once, to cause the output signal to decrease to the level for which the amplifier is designed.

A two terminal load device 89 has one terminal directly connected to the output terminal 79 and its other terminal connected to capacitor 84, the other end of which is connected to ground 24. The arrangement of load device 89 and capacitor 84 is such that they are in series circuit configuration with the load device 89 floating, that is any voltage measured across load device 89 is not with respect to ground. Capacitor 84 is chosen to have a relatively large value such as 500 microfarads, and serves two purposes. One purpose is to present a low impedance path to ground for the AC component of the output signal. Secondly, the capacitor 84 will charge up to, and assume the value of any DC component of signal appearing at the output terminal 79.

To briefly summarize the action a composite signal appears at the output terminal 79 and comprises an AC component and a DC component. The serial arrangement of load device 89 and capacitor 84 connecting the output terminal 79 with ground 24 is responsive to the output signal such that the AC component thereof appears solely across the load device 89 while the DC component thereof appears solely across the capacitor 84. In a typical circuit the load device 89 may be a speaker voice coil having a relatively low impedance in the order of 16 ohms.

A feedback circuit is connected to the capacitor, which has the DC output voltage thereacross, for feeding a portion of the DC voltage back to input terminal 17 to bias the input stage 12. In general, the DC voltage to be fed back is less than the entire voltage across the capacitor 84, so means are provided to feed back a portion of the total voltage, and to feed back the total of any change of DC output voltage caused by undesirable variations. To this end the feedback means includes a voltage reference means in the form of Zener diode 86 and resistance means 88. The Zener diode 86 is just one form of voltage reference means which may be utilized to establish a constant voltage. The voltage drop across resistance means 88, with respect to ground, is fed back through feedback resistor 91 and feedback line 92 to the input terminal 17. Any change in DC signal appearing across capacitor 84 will totally show up as a change in voltage across the resistance means 88. This may be demonstrated as follows. Since the Zener diode and resistance means 88 configuration is in parallel with the capacitor 84, the voltage across the capacitor will be the voltage across the Zener diode-resistance means 88 combination. Let us call this total voltage $V_T$. $V_T$ is divided up into a voltage drop across the Zener diode 86 and a voltage drop across the resistance means 88. If the voltage drop across the Zener diode is $V_Z$ and the voltage drop across the resistance means 88 is $V_R$ then $V_T=V_Z+V_R$. If the DC voltage at the ouptut terminal 79, and consequently the DC voltage across capacitor 84 should increase by an amount $\Delta V$, then the voltage across the Zener diode-resistance means combination increases by this amount $\Delta V$ since it is in parallel with the capacitor 84. Since the voltage drop across the Zener diode 86 is constant, the increase DC voltage $\Delta V$ will appear totally across the resistance means 88. Conversely, and by similar reasoning, any decrease in DC signal will also totally show up as a corresponding voltage decrease across the resistance means 88 since the voltage across the Zener diode 86 is a constant (unless the DC voltage drops below the breakdown voltage of the Zener diode 86). It is therefore seen that for any change in DC voltage there is a corresponding and exact change of voltage across the resistance means 88 which is fed back through feedback resistor 91 ($R_{91}$) to input terminal 17. The feedback factor is given by the relation $$\frac{Rin}{Rin+R_{91}}$$

where R*in* is the impedance looking into the base of the first transistor of the Darlington configuration 15, with the feedback resistor 91 disconnected. Various considerations are involved in determining the value of $R_{91}$. If the amplifier of FIG. 1 is to receive an input signal from a ceramic phonograph cartridge, for example, then $R_{91}$ should be relatively high so that the input impedance to the amplifier will be high. This input impedance is determined by the parallel combination of R*in* and $R_{91}$. However the value of $R_{91}$ should not be so high as to provide a low feedback factor determined by $$\frac{Rin}{Rin+R_{91}}$$

In order to maintain a high feedback factor, R*in* should be greater than ten times the value of $R_{91}$. For a 2K ohm value of emitter resistor 19, the three transistor Darlington 15 would have a typical value of 20 megohm. With $R_{91}$ having a value of .5 megohm the feedback factor would be approximately .97. Thus, the circuit achieves substantially unity feedback without the need for any type of additional feedback amplifiers.

One type of voltage reference, the Zener diode 86, is illustrated for use in the feedback network. The amount of constant voltage across the Zener diode 86 is determined by the Zener diode characteristics so that if a different $V_Z$ is required, a Zener diode having a different breakdown voltage may be utilized. The audio amplifier illustrated in FIG. 1, excluding the load device 89 and capacitor 84 is particularly well designed to be incorporated in a monolithic structure as an integrated circuit. If the amplifier is formulated by integrated circuit techniques, there may arise a problem as to the controlling and obtaining of a predetermined breakdown voltage of the Zener diode 86. In other words, it is sometimes difficult to fabricate a single Zener diode having a specific breakdown voltage above a predetermined value. For a more practical circuit wherein the constant voltage reference device may be easily fabricated in the integrated circuit, reference should now be made to FIG. 2.

Figure 2:
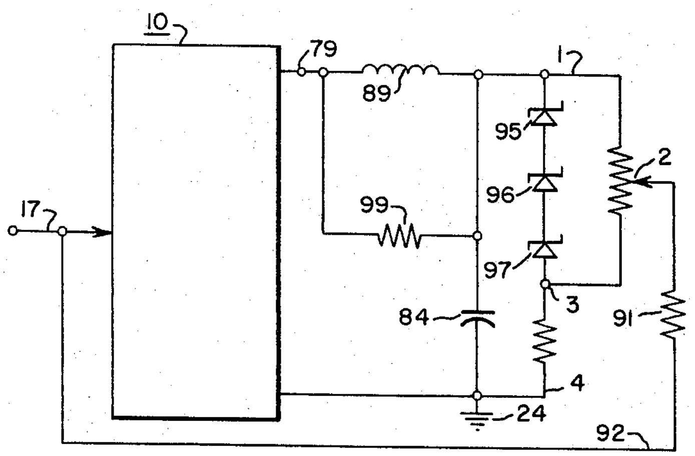
FIG. 2 illustrates a modification of the feedback network which lends itself to fabrication by integrated circuit techniques.

In FIG. 2 the block 10 represents all of the circuitry enclosed in the block 10 of FIG. 1 and like components shown in FIG. 2 have the correspondingly same reference numerals as in FIG. 1.

Points 1, 2, 3 and 4 have been marked in FIG. 2 in order to facilitate in the explanation of the feedback operation. Means are provided to establish a constant voltage from points 1 to 3. These means of FIG. 2 take the form of a plurality of Zener diodes 95, 96 and 97 each having a predetermined breakdown voltage determined by integrated circuit techniques. To establish a desired voltage between points 1 and 3, as many Zener diodes as practical may be fabricated with each contributing its breakdown voltage to the total. If the circuit of FIG. 2 is made from separate components, then the Zener diodes each having a predetermined breakdown voltage may be serially connected until a desired total breakdown voltage is obtained. A resistor is connected between points 3 and 4 and for purposes of explanation will be termed $R_{34}$. The circuit thus far explained is identical to that shown in FIG. 1 with the exception that instead of one Zener diode 86 (FIG. 1), FIG. 2 illustrates a plurality of Zener diodes each contributing its own specific breakdown voltage to the total.

FIG. 2 additionally shows a resistance path in parallel with the plurality of Zener diodes 95, 96 and 97. The resistance path similarly is connected from point 1 to point 3 and therefore the voltage across the resistance means from points 1 to 3 is identical to the constant voltage established by the Zener diodes and will remain unchanged even though the DC voltage at the output terminal 79 varies. The resistance means between points 1 and 3 will be termed $R_{13}$, which is broken down into two resistances $R_{12}$ and $R_{23}$, with the feedback resistor 91 connected to point 2. In an integrated circuit, $R_{12}$ and $R_{23}$ could be formulated as two separate resistors. In a component circuit, $R_{12}$ and $R_{23}$ could be either separate resistors, or $R_{13}$ could be a tapped variable resistor.

With a certain signal appearing at output terminal 79, a certain DC voltage is established across resistor $R_{34}$. If point 2 were moved down to coincide with point 3 then the DC voltage fed back would be the voltage from point 3 to point 4 (ground) and any change of DC signal would show up entirely across resistor $R_{34}$ as was the case with respect to the circuit of FIG. 1. Resistor means $R_{13}$ is inserted in parallel with the string of Zener diodes to obtain a larger value of feedback signal. With the arrangement of FIG. 2 the voltage from point 2 to 3 is constant and the voltage from point 3 to 4 will reflect any change in DC signal as was explained. Since the voltage fed back is the voltage at point 2 with respect to ground, the total voltage will have two components, that is, $V_{23}$ and $V_{34}$ and since $V_{34}$ reflects any change in DC voltage the voltage fed back from point 2 will similarly reflect this change at a higher voltage level. If the load device 89 of FIG. 1 is removed from the circuit, the feedback signal would be removed from the input stage and the output lead would rise to the supply voltage. In order to prevent this action, the load device 89 of FIG. 2 has a resistor 99 in parallel circuit configuration so that if the load device 89 is removed a current path will still be established through resistor 99 to preserve the DC voltage on capacitor 89 so that a DC signal may be fed back to properly bias the input stage. The value of resistance 99 is higher than that of the load device and by way of example if the load device 89 is a speaker coil with a value of 16 ohms, the parallel resistor 99 may have a value of 500 ohms.

Figure 3:
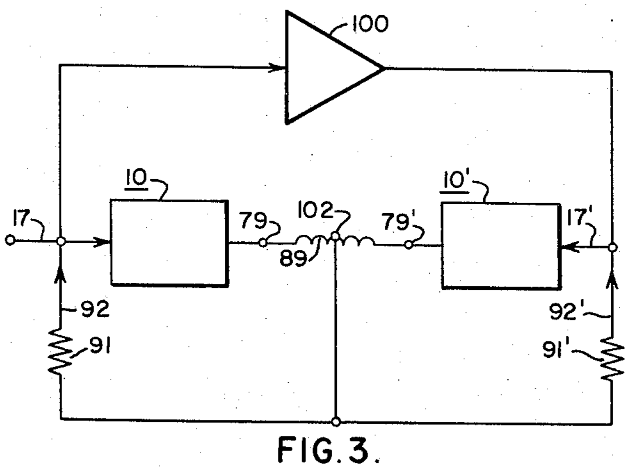
FIG. 3 illustrates another embodiment of the present invention.

FIG. 3 illustrates an embodiment of the present invention wherein the capacitor 84 may be eliminated. In FIG. 3, 10 and 10' represent the illustrated circuitry in the box 10 of FIGS. 1 and 2. An input signal is applied to input terminal 17 and is inverted, that is, changed in phase by 180°, by inverter 100 and applied to the input terminal 17' of amplifier 10'. With this arrangement any positive going signal at input terminal 17 is negatively going at terminal 17' and vice versa. It follows therefrom that any positive going output signal at output terminal 79 has a correspondingly negative going output signal at terminal 79' and vice versa. The load device 89 is similar to the load device shown in FIGS. 1 and 2 with the addition of a center tap 102 which is connected with both feedback resistors 91 and 91' to control the bias at the first stage of amplifiers 10 and 10'. Since the AC signals at terminals 79 and 79' are oppositely phased from one another they will cancel at the center tap 102 which then feeds back a pure DC signal for stabilization purposes.

The inverting amplifier 100 of FIG. 3 is illustrated simply to demonstrate the simultaneous application of an input signal and its complement. It is evident that other schemes for simultaneously applying an input signal to one amplifier and its complement to a second amplifier, could be utilized.

Although the present invention has been described with a certain degree of particularlity, it should be understood that the present disclosure has been made by way of example and that modifications and variations of the present invention are made possible in the light of the above teachings.

I claim as my invention:

1. An amplifier comprising:
a plurality of direct coupled amplifier stages including a first amplifier stage and a last amplifier stage;
a load device and capacitor serially connected, in the order named, between the output of said last amplifier stage and ground;
first, second, third and fourth points;
the junction between said load device and said capacitor constituting said first point and ground constituting said fourth point;
voltage reference means connected between said first and third points;
a resistor means connected between said third and fourth points;
resistance means connected between said first and third points in parallel with said voltage reference means; and
means for applying the voltage from a point, constituting said second point, intermediate said first and third points, to the input of said first amplifier stage.

2. An amplifier according to claim 1 wherein the second and third points are coincident.

3. An amplifier comprising:
an input stage including an input transistor;
a plurality of subsequent direct coupled transistor stages including an output stage having an output terminal;
means for biasing said transistors at an operating DC bias level;
a load device having one end connected to said output terminal;
a capacitor connnected between the other end of said load device and ground;
a feedback network connected to sense the voltage across said capacitor and including a serial arrangement of at least one Zener diode and resistor with one end of said serial arrangement connected to said other end of said load device and the other end of said serial arrangement connected to ground; and
means for applying the voltage across said resistor with respect to ground to the base electrode of said input transistor.

4. An amplifier comprising:
an input stage including an input transistor;
a plurality of subsequent direct coupled transistor stages including an output stage having an output terminal;
means for biasing said transistors at an operating DC bias level;
a load device having one end connected to said output terminal;
a capacitor connected to the other end of said load device and ground;
a feedback network connected to sense the voltage across said capacitor and including a serial arrangement of at least one Zener diode and resistor with one end of said serial arrangement connected to said other end of said load device and the other end of said serial arrangement connected to ground; and
resistance means connected in parallel with said Zener diode;
means for connecting a predetermined point on said resistance means to the base of said input transistor for applying the voltage at said point, with respect to ground, to bias said base electrode.

5. An amplifier system comprising:
a plurality of direct coupled amplifier stages including an input amplifier stage having an input terminal and an output amplifier stage having an output terminal;
a load device and capacitor serially connected, in the order named, between said output terminal and a point of common reference potential;
feedback means connected to said capacitor for obtaining a feedback voltage proportional to the voltage across said capacitor, with respect to said point of common reference potential;
means for applying said feedback voltage to said input terminal; and
a resistor connected in parallel with said load device for maintaining a current path if the load device is removed from the system.

References Cited

UNITED STATES PATENTS

| | | | |
|---|---|---|---|
| 3,188,574 | 6/1965 | Parmer | 330—28 X |
| 3,202,927 | 8/1965 | Ishimoto et al. | 330—124 X |
| 3,268,826 | 8/1966 | Harrison et al. | 330—304 X |
| 3,299,267 | 1/1967 | Howden | 330—16 X |

ROY LAKE, *Primary Examiner.*

E. C. FOLSOM, *Assistant Examiner.*